United States Patent
Huang

(10) Patent No.: US 6,743,706 B2
(45) Date of Patent: Jun. 1, 2004

(54) INTEGRATED CIRCUIT PACKAGE CONFIGURATION HAVING AN ENCAPSULATING BODY WITH A FLANGED PORTION AND AN ENCAPSULATING MOLD FOR MOLDING THE ENCAPSULATING BODY

(75) Inventor: Chien Ping Huang, Hsinchu Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/163,060

(22) Filed: Jun. 5, 2002

(65) Prior Publication Data

US 2002/0149104 A1 Oct. 17, 2002

Related U.S. Application Data

(62) Division of application No. 09/558,498, filed on Apr. 26, 2000, now Pat. No. 6,452,268.

(51) Int. Cl.⁷ ............................................... H01L 21/44
(52) U.S. Cl. ..................................... 438/611; 438/613
(58) Field of Search ............................. 257/730, 738, 257/710, 701, 737, 778, 787, 788, 688, 789; 438/117, 611, 613

(56) References Cited

U.S. PATENT DOCUMENTS

| | | | |
|---|---|---|---|
| 4,641,176 A | * | 2/1987 | Keryhuel et al. ....... 257/730 X |
| 4,768,081 A | | 8/1988 | Moeller |
| 5,334,872 A | * | 8/1994 | Ueda et al. .................. 257/675 |
| 5,436,407 A | | 7/1995 | Fehr et al. |
| 5,708,300 A | * | 1/1998 | Woosley et al. ............ 257/730 |
| 5,859,475 A | | 1/1999 | Freyman et al. |
| 6,072,239 A | | 6/2000 | Yoneda et al. |
| 6,075,289 A | | 6/2000 | Distefano |
| 6,144,107 A | | 11/2000 | Narita |
| 6,177,724 B1 | | 1/2001 | Sawai |
| 6,558,980 B2 | * | 5/2003 | Miyaki et al. .............. 438/112 |

OTHER PUBLICATIONS

Ito et al., Study of Encapsulating System for Diversified Area Bump Packages, IEEE 1997, pp. 46–53.*

* cited by examiner

Primary Examiner—Long Pham
Assistant Examiner—Hoa B. Trin
(74) Attorney, Agent, or Firm—Peter F. Corless; Steven M. Jensen; Edwards & Angell, LLP

(57) ABSTRACT

An integrated circuit package having an encapsulating body with a flanged portion and an encapsulating mold for molding the encapsulating body are proposed. It is a characteristic feature of the proposed encapsulating mold that the encapsulating-body cavity formed in the upper mold further includes a constricted cutaway portion in the rim thereof The constricted cutaway portion can be either uniform in thickness or formed in a multi-step staircase-like shape. During the molding process, the resin used to form the encapsulating body would flow into this constricted cutaway portion; and within the constricted cutaway portion, the resin would more quickly absorb the heat of the upper mold, thus increasing its viscosity and retarding its flowing speed. As a result, the resin would less likely to flash onto those surface parts of the substrate beyond the encapsulating body. This benefit allows the clamping force from the two molds to be reduced to a lower level; and therefore, it would not cause the undesired forming of micro-cracks in the substrate that would otherwise occur in the case of the prior art where a larger clamping force is required to prevent flash. The manufactured integrated circuit package is therefore more assured in quality and reliability. Moreover, the manufacture process can be more simplified to save manufacture cost.

4 Claims, 1 Drawing Sheet

INTEGRATED CIRCUIT PACKAGE CONFIGURATION HAVING AN ENCAPSULATING BODY WITH A FLANGED PORTION AND AN ENCAPSULATING MOLD FOR MOLDING THE ENCAPSULATING BODY

CROSS-REFERENCE TO RELATED APPLICATION(S)

This application is a divisional of copending application U.S. Ser. No. 09/558,498, filed on Apr. 26, 2000, now U.S. Pat. No. 6,452,268.

BACKGROUND OF THE INVENTION

1. Field of the Invention

This invention relates to integrated circuit (IC) packages, and more particularly, to an integrated circuit package having an encapsulating body with a flanged portion and a molding tool for molding the encapsulating body.

2. Description of Related Art

The BGA (Ball Grid Array) integrated circuit package allows an integrated circuit package to be made very small in size while nevertheless providing highly integrated functionality from a single integrated circuit package. By the BGA technology, a substrate is used as the chip carrier for the mounting of at least one integrated circuit chip thereon, and an encapsulating body is then formed to encapsulate the integrated circuit chip. The encapsulating body is typically formed through the use of an encapsulating mold including an upper mold and an opposing lower mold.

FIG. 6 is a schematic sectional diagram used to depict the fabrication of an encapsulating body for a BGA integrated circuit package. As shown, the BGA integrated circuit package includes an integrated circuit chip 10 mounted on a substrate 11. During the molding process, the semi-finished package configuration of the integrated circuit chip 10 and the substrate 11 is clamped between an upper mold 12 and a lower mold 13. The upper mold 12 is formed with an encapsulating-body cavity 14. When the upper mold 12 and the lower mold 13 are combined, an encapsulating material such as epoxy resin is filled into the encapsulating-body cavity 14 to thereby form an encapsulating body 15 therein.

In the foregoing integrated circuit package configuration, since the substrate 11 would have a thickness deviation of ±10.05 mm due to imprecision in fabrication, it would lead to the following problems during the molding process when the upper mold 12 and the lower mold 13 are combined to clamp the substrate 11.

First, when the substrate 11 is being clamped forcibly by the two mold halves, the thicker part thereof would be unduly pressed, thus resulting in the undesired forming of micro-cracks in the solder mask coated over the substrate 11, which would adversely affect the reliability of the internal circuitry of the resulted integrated circuit package.

Second, if the clamping force is reduced to prevent the above-mentioned problem, it would nevertheless allow a gap to be left between the bottom surface of the upper mold 12 and the top surface of the thinner part of the substrate 11, which would allow the flowing resin used in the molding process to flow through this gap, thus undesirably resulting in the flash of the resin over the top surface of the substrate 11. Although the flash can be later cleaned away, it would increase the overall manufacture cost and degrade the quality of the manufactured package.

Third, although the clamping force can be adjusted by a floating mechanism installed on the molds, it would be difficult to adjust for a suitable clamping force that would solve both of the above-mentioned two problems.

SUMMARY OF THE INVENTION

It is therefore an objective of this invention to provide an improved integrated circuit package, which can help prevent the flash of resin during the molding process for the encapsulating body.

It is another objective of this invention to provide an improved integrated circuit package, which can help prevent the forming of micro-cracks on as well as the flash of resin over the substrate during the molding process.

It is still another objective of this invention to provide an improved integrated circuit package, which can be manufactured without requiring a post-treatment process to clean away flash so as to allow the overall manufacture process more cost-effective to carry out.

In accordance with the foregoing and other objectives, the invention proposes an improved integrated circuit package which can help eliminate the above-mentioned problems of the prior art.

The integrated circuit package of the invention includes a substrate; an integrated circuit chip mounted on the substrate and electrically coupled to the substrate; and an encapsulating body for encapsulating the integrated circuit chip and part of the substrate, which is formed with an outwardly-extending flanged portion on the rim thereof at the junction between the encapsulating body and the substrate.

In accordance with the invention, the encapsulating mold used to form the encapsulating body includes an upper mold having an encapsulating-body cavity in communication with a constricted cutaway portion formed on the rim of the encapsulating-body cavity; and a lower mold for combination with the upper mold during molding process for the molding of the encapsulating body.

During the molding process, the resin used to form the encapsulating body would flow into this constricted cutaway portion; and within the constricted cutaway portion, the resin would more quickly absorb the heat of the upper mold, thus increasing its viscosity and retarding its flowing speed. As a result, the resin would be less likely to flash onto the surface parts of the substrate beyond the encapsulating body. This benefit allows the clamping force from the two mold halves to be reduced to a lower level that would hardly cause the forming of micro-cracks in the substrate as in the case of the prior art where a larger clamping force is required. The invention is therefore more advantageous to use than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

In accordance with the invention, two preferred embodiments are disclosed in full details in the following with reference to FIGS. 1–3 and FIGS. 4–5 respectively.

Figure 1:
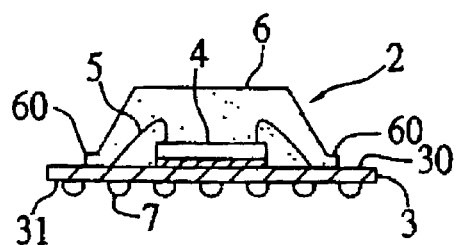
FIG. 1 is a schematic sectional diagram of a first preferred embodiment of the integrated circuit package of the invention.
Figure 2:
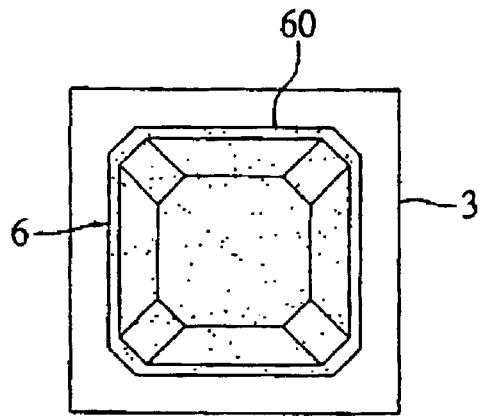
FIG. 2 is a schematic top view of the integrated circuit package of FIG. 1.
Figure 3:
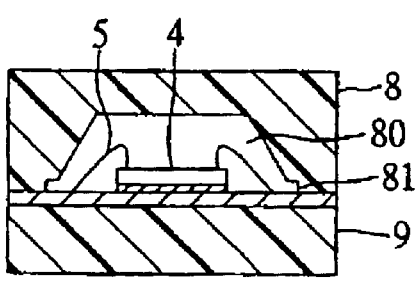
FIG. 3 is a schematic sectional diagram showing the fabrication of the integrated circuit package of FIG. 1 through the use of an encapsulating mold of the invention.
Figure 6:
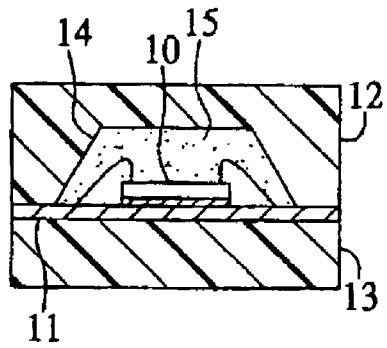
FIG. 6 (PRIOR ART) is a schematic sectional diagram showing the fabrication of a conventional integrated circuit package through the use of a conventional molding tool.

First Preferred Embodiment (FIGS. 1–3)

FIG. 1 is a schematic sectional diagram of a first preferred embodiment of the integrated circuit package of the invention (designated by the reference numeral 2). As shown, the integrated circuit package 2 includes a substrate 3; an integrated circuit chip 4 mounted on the substrate 3; a plurality of bonding wires 5 electrically coupling the integrated circuit chip 4 to corresponding bonding pads (not shown) on the substrate 3; an encapsulating body 6 for encapsulating the integrated circuit chip 4, the bonding wires 5, and the top surface 30 of the substrate 3; and a plurality of solder balls 7 mounted on the bottom surface 31 of the substrate 3.

The integrated circuit package of FIG. 1 is a BGA type of integrated circuit package; but it is to be noted that the invention is not limited to the use on this type of integrated circuit package, and can be also used on various other types of integrated circuit package configurations, including CSP (Chip Scale Package) and TFT (Thin Fine Tape) types of BGA packages.

In the manufacture process, the first step is to mount the integrated circuit chip 4 on the substrate 3, and then apply the bonding wires 5 to electrically couple the substrate 3 to corresponding bonding pads on the substrate 3. After this, the semi-finished package configuration is clamped between an upper mold 8 and a lower mold 9, as illustrated in FIG. 3. It is a characteristic feature of the invention that the encapsulating-body cavity 80 formed in the upper mold 8 further includes a constricted cutaway portion 81 in the rim thereof. This constricted cutaway portion 81 is preferably dimensioned to a width of from 0.5 mm to 1.5 mm (millimeter) and a depth of from 0.05 mm to 0.15 mm for optimal effect. During the molding process, the resin used to form the encapsulating body would flow into this constricted cutaway portion 81; and within the constricted cutaway portion 81, the resin would more quickly absorb the heat of the upper mold 8, thus increasing its viscosity and retarding its flowing speed. As a result, the resin would be less likely to flash onto the surface parts of the substrate 3 beyond the encapsulating body 6. This benefit allows the clamping force from the two mold halves 8, 9 to be reduced to a lower level that would hardly cause the forming of micro-cracks in the substrate 3 as in the case of the prior art where a larger clamping force is required. The manufactured integrated circuit package is therefore more assured in quality and reliability. Moreover, the manufacture process can be more simplified to save manufacture cost.

After the molding process is completed, the resulted encapsulating body 6 is additionally formed with a flanged portion 60 shaped from the constricted cutaway portion 81, as illustrated in FIGS. 1 and 2.

Figure 4:
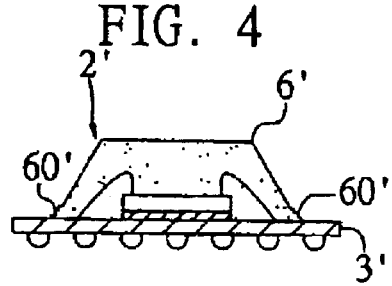
FIG. 4 is a schematic sectional diagram of a second preferred embodiment of the integrated circuit package of the invention.
Figure 5:
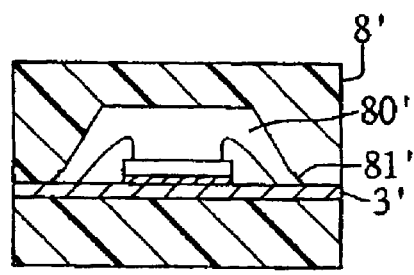
FIG. 5 is a schematic sectional diagram showing the fabrication of the integrated circuit package of FIG. 4 through the use of an encapsulating mold of the invention.

Second Preferred Embodiment (FIGS. 4–5)

FIG. 4 is a schematic sectional diagram of the second preferred embodiment of the integrated circuit package of the invention (designated by the reference numeral 2'). This embodiment differs from the previous one only in that the flanged portion 60' of the encapsulating body 6' here is formed in a multi-step staircase-like shape.

In the manufacture process, the semifinished package configuration is clamped between an upper mold 8' and a lower mold 9', as illustrated in FIG. 5. It is a characteristic feature of the invention that the encapsulating-body cavity 80' formed in the upper mold 8' further includes a constricted cutaway portion 81' in the rim thereof, and this constricted cutaway portion 81' is formed in a multi-step staircase-like shape, preferably dimensioned to a width of from 0.5 mm to 1.5 mm and a depth of from 0.05 mm to 0.15 mm for optimal effect. During the molding process, the resin used to form the encapsulating body would flow into this multi-step constricted cutaway portion 81'; and within the multi-step constricted cutaway portion 81', the resin would more quickly absorb the heat of the upper mold 8', thus increasing its viscosity at a faster rate than the previous embodiment. As a result, the resin would be retarded in its flowing speed and thus hardly can flash onto the surface parts of the substrate 3' beyond the encapsulating body 6'. This benefit allows the clamping force from the two mold halves 8', 9' to be reduced to a lower level that would hardly cause the forming of micro-cracks in the substrate 3' as in the case of the prior art where a larger clamping force is required. The manufactured integrated circuit package is therefore more assured in quality and reliability. Moreover, the manufacture process can be more simplified to save manufacture cost.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method far forming an encapsulating body far an integrated circuit package, the method comprising the steps of:

providing a substrate with a chin and bonding wires farmed on the substrate; and clamping the substrate with an upper mold and a lower mold, the upper mold having an encapsulating-body cavity in communication with a constricted cutaway portion formed on the rim of the encapsulating-body cavity such that the encapsulating body is fanned with a flanged portion at a junction between the encapsulating body and the substrate after a molding process for the molding of the encapsulating body.

2. The method of claim 1, wherein the constricted cutaway portion has a uniform thickness dimensioned to a width of from 0.5 mm to 1.5 mm and a depth of from 0.05 mm to 0.15 mm.

3. The method of claim 1, wherein the constricted cutaway portion is formed in a multi-step staircase shape dimensioned to a width of from 0.5 mm to 1.5 mm and a depth of from 0.05 mm to 0.15 mm.

4. The method of claim 1, wherein the constricted cutaway portion is formed in a multi-step shape.

* * * * *